US010141303B1

(12) United States Patent
Canning et al.

(10) Patent No.: US 10,141,303 B1
(45) Date of Patent: Nov. 27, 2018

(54) RF AMPLIFIER PACKAGE WITH BIASING STRIP

(71) Applicant: Infineon Technologies AG, Neubiberg (DE)

(72) Inventors: Timothy Canning, Morgan Hill, CA (US); Bjoern Herrmann, Morgan Hill, CA (US); Richard Wilson, Morgan Hill, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/709,532

(22) Filed: Sep. 20, 2017

(51) Int. Cl.
| | |
|---|---|
| *H01L 27/06* | (2006.01) |
| *H01L 23/498* | (2006.01) |
| *H01L 23/66* | (2006.01) |
| *H03F 3/195* | (2006.01) |
| *H03F 1/56* | (2006.01) |

(52) U.S. Cl.
CPC .... *H01L 27/0629* (2013.01); *H01L 23/49811* (2013.01); *H01L 23/49838* (2013.01); *H01L 23/66* (2013.01); *H03F 1/565* (2013.01); *H03F 3/195* (2013.01); *H03F 2200/222* (2013.01); *H03F 2200/225* (2013.01); *H03F 2200/387* (2013.01); *H03F 2200/391* (2013.01); *H03F 2200/451* (2013.01)

(58) Field of Classification Search
CPC ......... H01L 23/49811; H01L 23/49838; H01L 27/0629
See application file for complete search history.

(56) References Cited

U.S. PATENT DOCUMENTS

| | | | | |
|---|---|---|---|---|
| 9,629,246 | B2 * | 4/2017 | Mu ........................ | H05K 1/111 |
| 2010/0276189 | A1 * | 11/2010 | Song ....................... | H01L 23/13 174/260 |
| 2013/0015496 | A1 * | 1/2013 | Konno ................... | H01L 29/417 257/140 |
| 2013/0069215 | A1 * | 3/2013 | Nakao .................... | H01L 23/049 257/687 |
| 2013/0075932 | A1 * | 3/2013 | Schwarzer .......... | H01L 23/5226 257/774 |
| 2013/0128467 | A1 * | 5/2013 | Tsujino ................. | H01L 23/057 361/728 |
| 2013/0134569 | A1 * | 5/2013 | Ha ......................... | H01L 23/053 257/676 |
| 2013/0277819 | A1 * | 10/2013 | Yoshida .................. | H01L 21/52 257/687 |

(Continued)

*Primary Examiner* — Nathan W Ha
(74) *Attorney, Agent, or Firm* — Murphy, Bilak & Homiller, PLLC (57) ABSTRACT

An RF semiconductor amplifier package includes a flange shaped body section, an electrically conductive die pad centrally located on the body section, and an electrically insulating window frame disposed on an upper surface of the body section. A first electrically conductive lead is disposed on the window frame adjacent to a first side of the die pad and extends away from the first side of the die pad towards a first edge side of the body section. A second electrically conductive lead is disposed on the window frame adjacent to a second side of the die pad and extends away from the second side of the die pad towards a second edge side of the body section. A first electrically conductive biasing strip is disposed on the window frame, continuously connected to the second lead, and extends along and a third side of the die pad.

18 Claims, 6 Drawing Sheets

(56) References Cited

U.S. PATENT DOCUMENTS

| | | | | |
|---|---|---|---|---|
| 2014/0035123 A1* | 2/2014 | Oka | ...................... | H01L 23/367 257/712 |
| 2014/0035605 A1* | 2/2014 | Kurz | ...................... | G01R 27/02 324/713 |
| 2017/0213811 A1* | 7/2017 | Das | ...................... | H01L 25/072 |
| 2017/0245359 A1* | 8/2017 | Mu | ...................... | H05K 1/0213 |

* cited by examiner

RF AMPLIFIER PACKAGE WITH BIASING STRIP

FIELD OF TECHNOLOGY

The present application relates to RF (radio frequency) amplifiers, and in particular relates to package designs for RF amplifiers.

BACKGROUND

RF power amplifiers are used in a variety of applications such as base stations for wireless communication systems, etc. The signals amplified by the RF power amplifiers often include signals that have a high frequency modulated carrier having frequencies in the 400 megahertz (MHz) to 60 gigahertz (GHz) range. The baseband signal that modulates the carrier is typically at a relatively lower frequency and, depending on the application, can be up to 300 MHz or higher. Many RF power amplifier designs utilize a semiconductor switching device as the amplification device. Examples of these switching devices include power transistor devices, such as a MOSFET (metal-oxide semiconductor field-effect transistor), a DMOS (double-diffused metal-oxide semiconductor) transistor, a GaN HEMT (gallium nitride high electron mobility transistor), a GaN MESFET (gallium nitride metal-semiconductor field-effect transistor), an LDMOS transistor, etc.

A device package for an RF power amplifier can include a transistor die (e.g., MOSFET (metal-oxide semiconductor field-effect transistor), LDMOS (laterally-diffused metal-oxide semiconductor), HEMT (high electron mobility transistor) along with an input and output impedance matching circuit incorporated therein. The input and output impedance matching circuits typically include LC networks that provide at least a portion of an impedance matching circuit that is configured to match the impedance of the transistor die to a fixed value.

Class F amplifier configurations are gaining increased favor due to their highly efficient operation in modern RF applications. Class F amplifier design requires careful tuning of higher order harmonics. Power efficiency can be improved by incorporating harmonic tuning circuits in to the input and output impedance matching circuits that are incorporated into the device package.

Modern RF power amplifiers are required to maintain as high efficiency as possible over a high range of output power. This design imperative can be particularly challenging in RF power amplifiers with small devices or devices with high power density (e.g., GaN HEMT devices). These devices are typically packaged with a number of electrically conductive bond wires connected between the input and output terminals of the transistor die and the package leads. In this configuration, capacitive coupling can occur between the various wires of the packaged device and/or between the bond wires and the substrate portion of the package. Currently, GaN HEMT devices are predominantly "bonded straight out." This means that the drain of the transistor die is directly electrically connected to a lead of the package by a set of dedicated bond wires. This package configuration is easy to produce in practice, but results in a large parasitic network at the output of the transistor. This parasitic network limits the ability to tune higher order harmonics. This parasitic network is also detrimental for the baseband impedance (i.e., the impedance presented in the fundamental operating frequency range), a metric which is important for the linearizability of the transistor. The bond wires in conjunction with the package effectively appear as an inductance, which forms a resonator in parallel with the parasitic output impedance of the transistor. This presents a high impedance to the transistor which in turn generates a large gain spike in the baseband region.

SUMMARY

An RF semiconductor amplifier package is disclosed. According to an embodiment, the RF semiconductor amplifier package includes a flange shaped body section, an electrically conductive die pad centrally located on the body section, and an electrically insulating window frame disposed on an upper surface of the body section and surrounding the die pad. The RF semiconductor amplifier package further includes a first electrically conductive lead disposed on the window frame adjacent to a first side of the die pad and extending away from the first side of the die pad towards a first edge side of the body section. The RF semiconductor amplifier package further includes a second electrically conductive lead disposed on the window frame adjacent to a second side of the die pad and extending away from the second side of the die pad towards a second edge side of the body section, the second side of the die pad being opposite the first side of the die pad. The RF semiconductor amplifier package further includes a first electrically conductive biasing strip that is disposed on the window frame, continuously connected to the second lead, and extends along and a third side of the die pad. The third side of the die pad extends between the first and second sides of the die pad.

According to another embodiment, the RF semiconductor amplifier package includes a flange shaped body section having a first edge side and a second edge side opposite the first edge side, an electrically conductive die pad centrally located on the body section between the first and second edge sides, an electrically insulating window frame disposed on an upper surface of the section and surrounding the die pad, and a continuous electrically conductive structure disposed on the window frame and electrically insulated from the die pad. The continuous electrically conductive structure includes a lead portion extending away from the die pad towards the second edge side of the body section, and a biasing strip that extends around an outer perimeter of the die pad towards the first edge side of the body section.

A packaged RF amplifier is disclosed. According to an embodiment, the packaged RF amplifier includes an RF package, including: a flange shaped body section, an electrically conductive die pad, an electrically conductive input lead that is insulated from the die pad and extends away from a first edge side of the die pad, an electrically conductive output lead that is insulated from the die pad and extends away from a second edge side of the die pad in an opposite direction as the input lead, and a first electrically conductive biasing strip that is continuously connected to the electrically conductive output lead and extends around an outer perimeter of the die pad towards the first edge side of the flange. The packaged RF amplifier further includes an RF transistor mounted on the die pad. The RF transistor includes: a control terminal that is electrically coupled to the first lead, a reference potential terminal that directly faces and is electrically connected to the die pad, and an output terminal that is electrically connected to the second lead.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, depicts a packaged RF amplifier with a biasing strip, according to an embodiment.

FIG. 4, which includes FIGS. 4A and 4B, depicts a packaged RF amplifier, according to another embodiment.

FIG. 5, which includes FIGS. 5A and 5B, depicts a packaged RF amplifier, according to another embodiment. FIG. 5A depicts an equivalent schematic of the packaged RF amplifier, and FIG. 5B depicts a plan view of the package and capacitors that are mounted outside of the package.

FIG. 6, which includes FIGS. 6A, 6B and 6C, depicts a packaged RF amplifier, according to another embodiment.

DETAILED DESCRIPTION

According to embodiments described herein, an RF amplifier package is disclosed. The package includes a metal flange, an electrically conductive die pad centrally located on the metal flange, and an electrically insulating window frame disposed on an upper surface of the metal flange and surrounding the die pad. Electrically conductive input and output leads are leads are disposed on the window frame and extend away from either side of die pad. Integrated circuit components, e.g., transistors, capacitors, etc., can be mounted on the die pad and electrically connected to the input and output leads using bond wires, for example.

Advantageously, the RF amplifier package includes an electrically conductive biasing strip that extends along a side of the die pad that is not adjacent to any package leads. According to one embodiment, the biasing strip is continuously connected to the output lead of the RF amplifier package. The biasing strip can advantageously be isolated from the RF signal that is transmitted on the output lead. By providing the electrically conductive biasing strip in the RF amplifier package, a substantially greater area is made available for the electrical connection of components in the output network of the amplifier device. This produces numerous benefits, some of which will be discussed in the following description of the figures.

Figure 1:
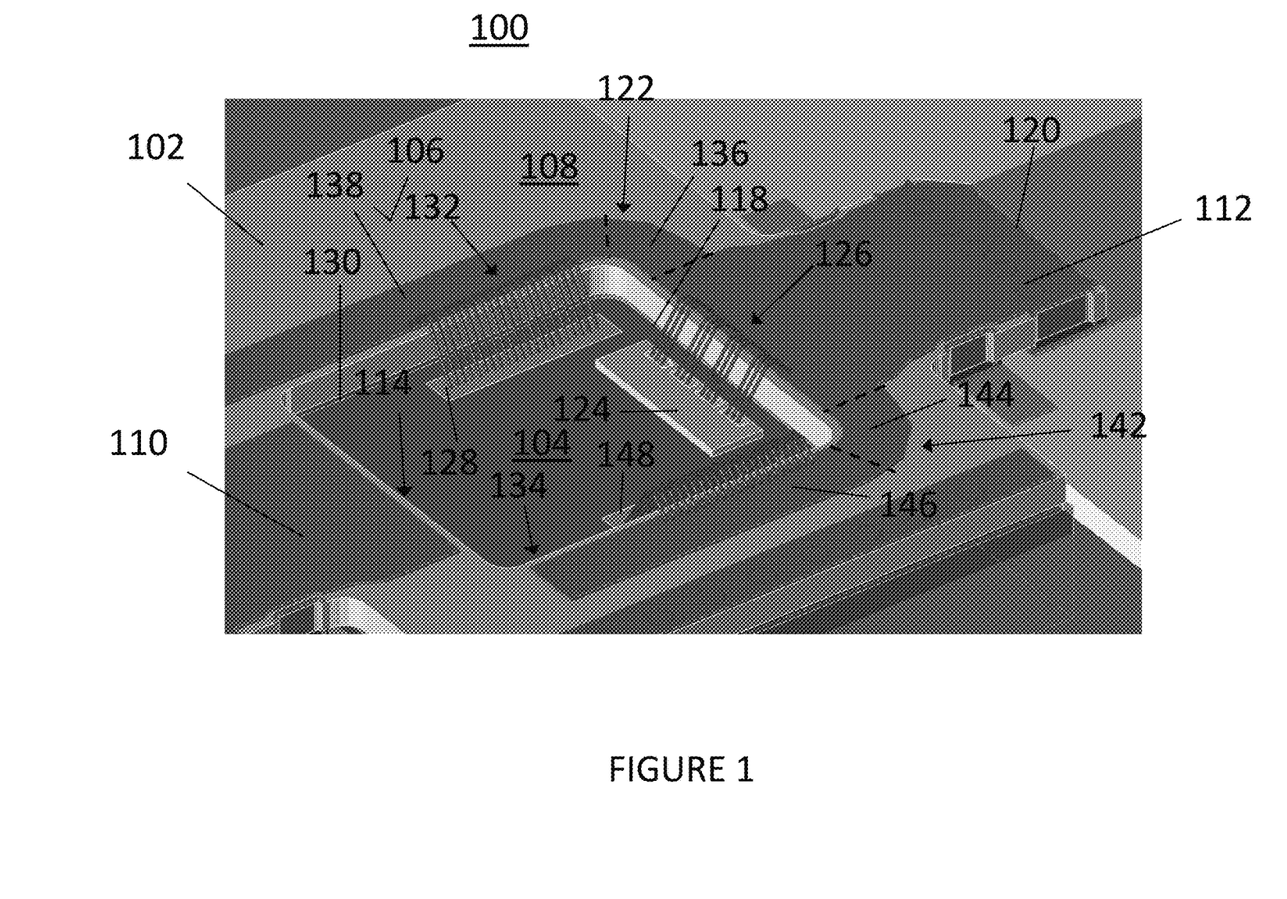
FIG. 1 depicts an RF amplifier package with a biasing strip, according to an embodiment.

Referring to FIG. 1, an RF amplifier package 100 is depicted, according to an embodiment. The RF amplifier package 100 includes a flange shaped body section 102. The flange shaped body section 102 is configured to be inserted into an external apparatus, such as the socket of a printed circuit board, and is configured to provide a conduit between the external apparatus and one or more integrated circuits that are mounted on the flange portion. In some embodiments, the flange shaped body section 102 is configured as a heat sink that dissipates heat away from the integrated circuits mounted thereon to an external heat sink. Generally speaking, the body section 102 can include electrically conductive materials, and/or thermally conductive materials, electrically insulating materials, and/or thermally insulating materials. Exemplary insulating materials (both thermal and electrical) include ceramics, plastics, and semiconductor based insulators such as semiconductor oxides, semiconductor nitrides and semiconductor oxynitrides. Exemplary conductive materials include metals such as copper, aluminum and alloys thereof.

The RF amplifier package 100 additionally includes an electrically conductive die pad 104 centrally located on the body section 102. As used herein, "centrally located" refers to the fact that the die pad 104 is completely laterally spaced apart from every outer edge side of the body section 102. The die pad 104 can have a generally planar upper surface that is configured to accommodate one or more integrated circuit devices (e.g., transistors, chip capacitors, etc.) directly mounted thereon. In one embodiment, the upper surface of the die pad 104 is vertically recessed on a plane that is beneath an upper surface 106 of the body section 102. That is, a ridge is formed in the body section 102 around the perimeter of the die pad 104. The die pad 104 can have a variety of different geometries. In the depicted embodiment, the die pad 104 has a square geometry. Other rectangular geometries are possible. More generally, the die pad 104 can have the geometry of any enclosed shape.

The die pad 104 can include any of a variety of electrically conductive materials, including electrically conductive metals such as copper, aluminum and alloys thereof. In one embodiment, the die pad 104 is part of a metal baseplate that is made of an electrically and thermally conductive material such as Cu, CPC (copper, copper-molybendum, copper laminate structure), CuW, etc. A metal slug (not shown) can be disposed beneath the baseplate, and a heatsink (not shown) including a thermal conductor, e.g., aluminum or copper can be disposed beneath the metal slug and extend to a lower side of the RF semiconductor amplifier. In this way, the semiconductor amplifier package acts as a heat sink. An example of such a structure is disclosed in U.S. Pat. No. 9,629,246 to Mu, the content of which is incorporated by reference in its entirety.

The RF amplifier package 100 additionally includes an electrically insulating window frame 108 that is disposed on the upper surface 106 of the of the body section 102. The electrically insulating window frame 108 can include a variety of electrically and/or thermally insulating materials such as ceramic, plastic, etc. The electrically insulating window frame 108 surrounds the die pad 104. That is, the electrically insulating window frame 108 forms an enclosed loop around the periphery of the die pad 104. Optionally, as shown in the figures, the electrically insulating window frame 108 can completely cover all of the exposed upper surface 106 of the body section 102 outside of the die pad 104.

The RF amplifier package 100 further includes a plurality of electrically conductive leads. The electrically conductive leads can be formed from any of a variety of electrically conductive materials, including electrically conductive metals such as copper, aluminum and alloys thereof. The leads provide electrical access between the packaged components that are mounted on the die pad 104 and an external apparatus, e.g., a printed circuit board. At a minimum, the RF amplifier package 100 includes at least two leads. In the depicted embodiment, the package includes a first lead 110 and a second lead 112. The first and second leads 110, 112, may be, but are not necessarily, substantially equal in width. Generally speaking, the first and second leads 110, 112 may have a variety of different shapes and sizes different from those shapes that are depicted in FIG. 1.

Figure 2A:
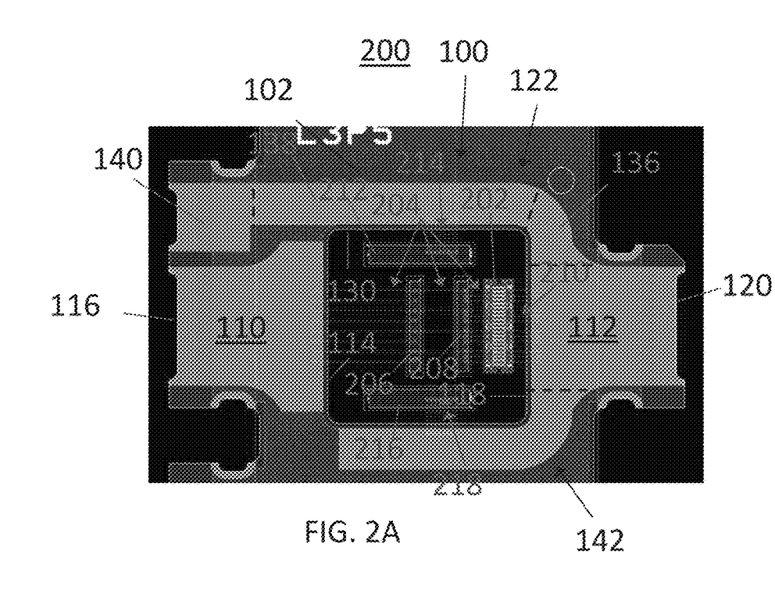
FIG. 2A depicts a plan view of the packaged RF amplifier.

Both the first and second leads 110, 112 are disposed on the window frame 108 adjacent to the die pad 104. The first lead 110 extends away from a first side 114 of the die pad 104 towards a first edge side 116 (identified in FIG. 2A) of the body section 102. On an opposite side of the RF amplifier package 100, the second lead 112 extends away from a second side 118 (identified in FIG. 2A) of the die pad 104 towards a towards a second edge side 120 of the body section 102 that is opposite form the first edge side 116 of the body section 102. Thus, the first and second leads 110, 112 extend away from one another in opposite directions. In the depicted embodiment, the first lead 110 terminates at the first edge side 116 of the body section 102 and the second lead 112 terminates at the second edge side 120 of the body section 102. That is, outer edge sides of the first and second leads 110, 112 are coextensive with the outer edges of the body section 102. In other embodiments, the first and second leads 110, 112 may extend past the first and second edge sides 116, 120 of the body section 102, respectively.

According to one embodiment, the RF amplifier package 100 is a so-called PCB based RF-power package. Examples of these package designs are described in U.S. Pat. No. 8,907,467 to Komposch, the content of which is incorporated by reference in its entirety, and U.S. PG PUB 2017/0245359 to Mu, the content of which is incorporated by reference in its entirety. To summarize the design of these package types, the package design is treated as part of the electrical design of the system instead of a just a mechanical component. To this end, the RF amplifier package 100 can include a multilayer printed circuit board that is incorporated into the body section 102. This multilayer printed circuit board includes signal and ground layers. Various RF components can be embedded within the multi-layer circuit board using the embedded signal layer. Examples of these RF components include integrated harmonics resonators, balanced power combiner networks, etc. In this way, fewer external components are needed and space efficiency of the package is improved.

The RF amplifier package 100 additionally includes a first electrically conductive biasing strip 122. The first biasing strip 122 can be continuously connected to the second lead 112. That is, the second lead 112 and the first biasing strip 122 can collectively form an uninterrupted path of electrically conductive material. For example, the first biasing strip 122 and the second lead 112 can be part of a common metal later that is patterned and affixed or disposed on top of the window frame 108, or integrated within the body section 102 as part of a PCB structure. The first biasing strip 122 is disposed on the window frame 108 adjacent to the die pad 104. According to an embodiment, the first biasing strip 122 is immediately adjacent to the die pad 104. In some embodiments, the first biasing strip 122 can be situated as close to the die pad 104 as is practically possible within processing capabilities.

Advantageously, the first biasing strip 122 provides additional lateral space for the electrical connection of elements that are disposed on the die pad 104 to an external bias. FIG. 1 illustrates one potential configuration of integrated circuit elements that advantageously utilizes the additional connection area provided by the first biasing strip 122. In the depicted embodiment, a first integrated circuit 124 is disposed on the die pad 104 immediately adjacent to the second side 118 of the die pad 104. This first integrated circuit 124 may be an RF transistor, for example. A direct electrical connection between the first integrated circuit 124 and the second lead 112 is effectuated by a first set 126 of electrically conductive bond wires that are directly connected between the first integrated circuit 124 element and the second lead 112. Meanwhile, a second integrated circuit 128 is disposed on the die pad 104 immediately adjacent to a third side 130 of the die pad 104. The third side 130 of the die pad 104 extends between the first and second sides 114, 118 of the die pad 104, and is immediately adjacent to the first biasing strip 122. A direct electrical connection between the second integrated circuit 128 and the first biasing strip 122 is effectuated by a second set 132 of electrically conductive bond wires that are directly connected between the second integrated circuit 128 and the first biasing strip 122.

The provision of the first biasing strip 122 in the RF amplifier package 100 advantageously improves the space efficiency and electrical performance of the RF amplifier package 100 in comparison to conventional designs. In a conventional package design that does not include the first biasing strip 122, the elements of the output impedance matching network (e.g., chip capacitors) should ideally be placed as close as possible to the output terminal of the RF transistor for minimal degradation in performance due to parasitic effects. The presence of these elements near the output terminal of the RF transistor restricts the number of bond wires that can connect the transistor die to the output lead, as these bond wires from the various elements are interleaved with one another. Moreover, this configuration is prone to interference due to the close proximity of the various bond wires. In comparison, the configuration shown in FIG. 1 allows the output capacitors to be moved to a different location of the die pad 104 with the transistor die being disposed immediately adjacent to the output lead. A greater number of bond wires can be used to directly connect the transistor die to the output lead (i.e., the second lead 112 in the depicted arrangement). Moreover, these bond wires are substantially spaced apart from the bond wires that connect capacitors in the output matching network such that interference between the two is non-existent or negligible.

Figure 2B:
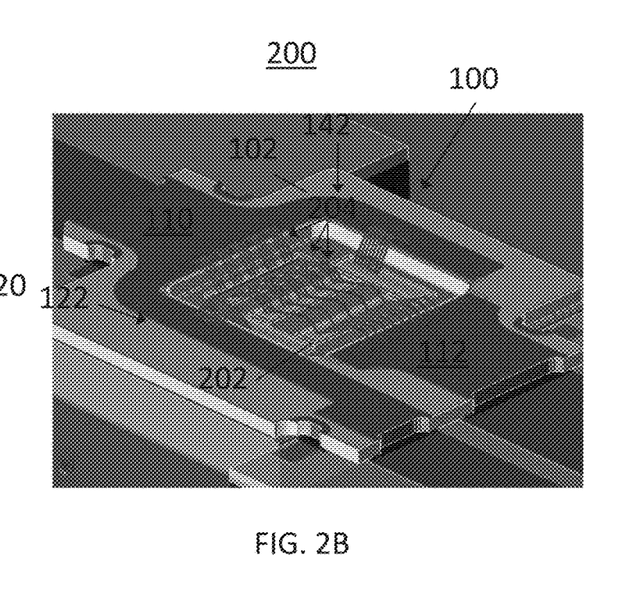
FIG. 2B depicts an isometric view of the packaged RF amplifier.

The first biasing strip 122 is formed to extend around the perimeter of the die pad 104 in such a way that it extends towards the first edge side 116 of the body section 102. Thus, the first biasing strip 122 includes a portion that extends in an opposite direction as the second lead 112. In the depicted embodiment, the die pad 104 is rectangular, and has linear third and fourth sides 130, 134 that each form a perpendicular angle with the linear first and second sides 114, 118. The first biasing strip 122 extends away from the second lead 112 and around the perpendicular corner formed between the second and third sides 118, 130 of the die pad 104 so as to travel alongside and parallel to the third side 130 of the die pad 104. To this end, the first biasing strip 122 includes a first section 136 that is connected to the second lead 112 and extends along a portion of the second side 118 of the die pad 104 and around the corner between the second and third sides of the die pad 104. At this location, the first section 136 forms a perpendicular intersection with a second elongated section 138 of the first biasing strip 122. This intersection between the second elongated section 138 and the first section 136 of the first biasing strip 122 is immediately adjacent to the corner between the second and third sides 118, 132 of the die pad 104. The second elongated section 138 of the first biasing strip 122 extends at least partially along the third side 130 of the die pad 104 while being disposed immediately adjacent to the third side 130 of the die pad 104. According to one embodiment, the second elongated section 138 extends completely along the third side 130 of the die pad 104. That is, the second elongated section 138 of the first biasing strip 122 extends at least to the first side 114 of the die pad 104. Optionally, the second elongated section 138 of the first biasing strip 122 may extend completely and continuously across the body section 102 so as to reach the first edge side 116 of the body section 102. This feature is shown in FIG. 2. In addition, an enlarged pad portion 140 may be provided at the end of the second elongated section 138 of the first biasing strip 122 so as to provide increased area for external connections, e.g., from external bond wires or conductive traces. This feature is also shown in FIG. 2.

Referring again to FIG. 1, the RF amplifier package 100 may optionally include a second biasing strip 142 that is configured to provide additional lateral space for the electrical connection of elements that are disposed on the die pad 104 to an external bias in a similar manner as previously described with reference to the first biasing strip 122. The second biasing strip 142 includes a third section 144 that extends along the second side 118 of the die pad 104 and a fourth elongated section 146 that forms an angled intersection with the third section 144. The fourth elongated section 146 is immediately adjacent to the fourth side 134 of the die pad 104 that extends between the first and second sides, and is opposite to the third side 130 of the die pad 104. In the depicted embodiment, the fourth elongated section 146 extends completely along the fourth side 134 of the die pad 104, but does not reach the first edge side 116 of the body section 102. In other embodiments, the fourth elongated section 146 may extend further to reach the first edge side 116 of the body section 102. As shown in FIG. 1, a third integrated circuit 148 may be electrically connected to the second biasing strip 142 in a similar manner as previously described with respect to the first biasing strip 122.

Depending on the geometry of the die pad 104, the geometry of the first biasing strip 122 and/or the second biasing strip 142 may be correspondingly adapted to at least partially extend around a perimeter of the die pad 104 to reach a location that is sufficiently distant to the second lead 112 to provide a connection location for multiple discrete components, e.g., as depicted in FIG. 1. Although the depicted embodiment shows a rectangular shaped die pad 104, a variety of different die pad 104 geometries are possible. For example, the outer perimeter of the die pad 104 may include an angled intersection between two linear sides that form an oblique angle with one another. In this case, the first biasing strip 122 and/or the second biasing strip 142 may include two linear sections that form a corresponding oblique angle with one another that is adjacent to the oblique angle in the outer perimeter of the die pad 104. Similarly, the outer perimeter of the die pad 104 may include one or more curves and the sections of the first biasing strip 122 and/or the second biasing strip 142 can be formed with corresponding curves that mirror this geometry.

Referring to FIG. 2, a packaged RF amplifier 200 is depicted, according to an embodiment. The packaged RF amplifier 200 includes the RF amplifier package 100 as described with reference to FIG. 1. In this configuration, the first lead 110 provides an input lead for the packaged RF amplifier 200 and the second lead 112 provides an output lead for the packaged RF amplifier 200. An RF transistor 202 is mounted on the die pad 104. The RF transistor 202 is mounted immediately adjacent to the second side 118 of the die pad 104. Accordingly, there are no other discrete elements disposed between the RF transistor 202 and the second side 118 of the die pad 104.

The RF transistor 202 can be selected form a variety of different device types, such as LDMOS (laterally diffused metal-oxide-semiconductor), IGBT (insulated gate bipolar transistor), HEMT (high electron mobility electron transistor), etc. These device types can be formed in a variety of different semiconductor material technologies, e.g., Si (silicon), SiC (silicon carbide), SiGe (silicon germanium), GaN (gallium nitride), GaAs (gallium arsenide), etc. In the depicted embodiment, the RF transistor 202 die has a so-called "source down" configuration. In this configuration, the lower surface of the RF transistor 202 includes an electrically conductive source terminal that faces and directly electrically connects with the die pad 104. Attachment and electrical connection between the source terminal and the die pad 104 can be provided by a conductive paste or solder. In this configuration, the die pad 104 acts as an electrical terminal of the package (e.g., a GND terminal) as well as a mounting surface for the RF transistor 202. A control terminal of the RF transistor 202 (e.g., a gate terminal) and an output terminal of the of the RF transistor 202 (e.g., a drain terminal) are disposed on an upper surface of the RF transistor 202 die that is opposite the lower surface of the RF transistor 202.

The control terminal of the RF transistor 202 is electrically coupled to the first lead 110. In the depicted embodiment, this electrical coupling is provided by an input group 204 of bond wires that is electrically connected between the control terminal of the RF transistor 202 and the first lead 110. Optionally, the packaged RF amplifier 200 may include first and second input capacitors 206, 208 that are disposed between the RF transistor 202 and the first lead 110. These first and second input capacitors 206, 208 include lower terminals that directly face and electrically connect to the die pad 104 and upper terminals that face away from the die pad 104. The input group 204 of bond wires of bond wires forms a series electrical connection between the first lead 110, the upper terminals of the first and second input capacitors 206, 208, and the control terminal of the RF transistor 202.

The output terminal of the RF transistor 202 is electrically coupled to the second lead 112. According to an embodiment, this electrical coupling is provided by a first set of 210 electrically conductive bond wires that extends directly from the output terminal of the RF transistor 202 to the second lead 112.

The packaged RF amplifier 200 further includes a first capacitor 212 that is mounted on the die pad 104. The first capacitor 212 is mounted immediately adjacent to the third side 130 of the die pad 104. That is, there are no other discrete elements disposed between the first capacitor 212 and the third side 130 of the die pad 104. The first capacitor 212 is configured as a chip capacitor with a lower terminal that directly faces and electrically connects to the die pad 104. An upper terminal of the first capacitor 212 faces away from the die pad 104. The upper terminal of the first capacitor 212 is electrically connected to the first biasing strip 122. According to an embodiment, this electrical coupling is provided by a second set 214 of electrically conductive bond wires that extends directly from the upper terminal of the first capacitor 212 to the first biasing strip 122.

Optionally, the packaged RF amplifier 200 further includes a second capacitor 216 that is mounted on the die pad 104. The second capacitor 216 is mounted immediately adjacent to the fourth side 134 of the die pad 104. That is, there are no other discrete elements disposed between the RF transistor 202 and the fourth side 134 of the die pad 104. The second capacitor 216 is configured as a chip capacitor with a lower terminal that directly faces and electrically connects to the die pad 104. An upper terminal of the second capacitor 216 faces away from the die pad 104. The upper terminal of the first capacitor 212 is electrically connected to the second biasing strip 142. According to an embodiment, this electrical coupling is provided by a third 218 set of electrically conductive bond wires that extends directly from the upper terminal of the second capacitor 216 to the second biasing strip 142.

Figure 3:
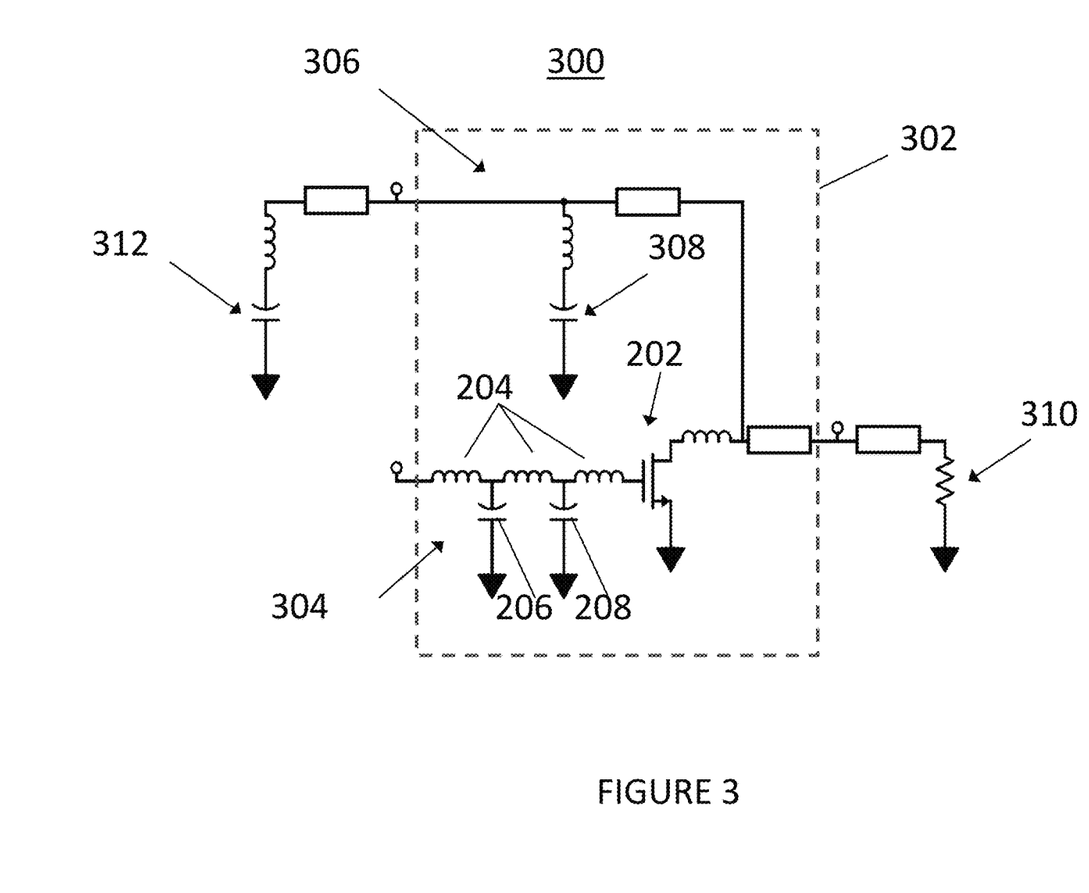
FIG. 3 depicts an equivalent electrical schematic of the packaged RF amplifier of FIG. 2, according to an embodiment.

Referring to FIG. 3, a circuit schematic of an amplifier circuit 300 that includes the packaged RF amplifier 200 described with reference to FIG. 2 is depicted. A package outline 302 provided in the schematic to delineates the circuit elements that are provided within the packaged RF amplifier 200 from the circuit elements that are provided outside of the packaged RF amplifier 200.

The amplifier circuit 300 includes an input impedance matching network 304 connected between the input terminal of the packaged RF amplifier 200 and the control terminal of the RF transistor 202. The input impedance matching network 304 is provided by the input group 204 of bond wires and the first and second input capacitors 206, 208. The input group 204 of bond wires act as inductors in this network, and the height and spacing of the input group 204 of bond wires can be adjusted to provide a desired inductance. This input impedance matching network 304 can be configured to, among other things, match an input impedance of the amplifier circuit 300 to a fixed value, e.g., 50 ohms.

The amplifier circuit 300 additionally includes an output impedance matching network 306 connected between the output terminal of the RF transistor 202 and the output terminal of the packaged RF amplifier 200. The output impedance matching network 306 includes a first LC resonator 308 that is connected in parallel with the output of the RF transistor 202. The capacitance of the first LC resonator 308 is provided at least in part by the first capacitor 212. The inductance of the of the first LC resonator 308 is provided by the combination of the second set 214 of bond wires and the first biasing strip 122. Additional capacitance and inductance can be added using the second biasing strip 142 and the second capacitor 216. In either case, the inductance of the first LC resonator 308 can be can be adjusted by appropriately tailoring the physical parameters of the second biasing strip 142 (e.g., width, shape, etc.). The first LC resonator 308 is configured form a parallel resonant circuit with the characteristic output capacitance of the RF transistor 202 and thereby improve the output efficiency of the circuit.

Outside of the packaged RF amplifier 200, the amplifier circuit 300 includes a resistive load 310 that is connected to the second lead 112 of the RF amplifier package 100. Additionally, outside of the packaged RF amplifier 200, the amplifier circuit 300 includes a DC decoupling capacitor 312 that is connected to the output terminal of the RF transistor 202. The DC decoupling capacitor 312 can be provided in an external apparatus, such as a PCB, near the first edge side 116 of the body section 102. The electrical connection between the output terminal of the RF transistor 202 and the DC decoupling capacitor 312 can be provided using the first biasing strip 122. In particular, the DC decoupling capacitor 312 can be connected to the enlarged pad portion 140 of the biasing strip that is adjacent the first edge side 116 of the body section 102, e.g., as described with reference to FIG. 2. The DC decoupling capacitor 312 has a very large capacitance value (e.g., 1 µF (microfarad) or greater). The DC decoupling capacitor 312 enhances baseband performance by maintaining a low impedance at the transistor drain terminal 202.

The design of the RF amplifier package 100 enables several notable performance benefits for the amplifier circuit 300 in comparison to similar RF amplifier circuit topologies that utilize conventional package designs. For example, the parameters of the first LC resonator 308 (e.g., inductance and capacitance) have greater flexibility and tunability than conventional package designs. One reason for this is that the first and second capacitors 212, 216 can be provided using silicon capacitors. By way of comparison, MLCC (ceramic surface mount capacitors) are commonly utilized in conventional straight bonded configurations due to space constraints. These space constraints are eliminated by the first biasing strip 122. In addition, because the first LC resonator 308 can be formed using PCB materials from the package structure (e.g., in an embodiment in which the RF amplifier package 100 is configured as a so-called PCB based RF-power package) a higher quality factor than conventional bond wires is achieved for the inductance portion of the first LC resonator 308.

Figure 4A:
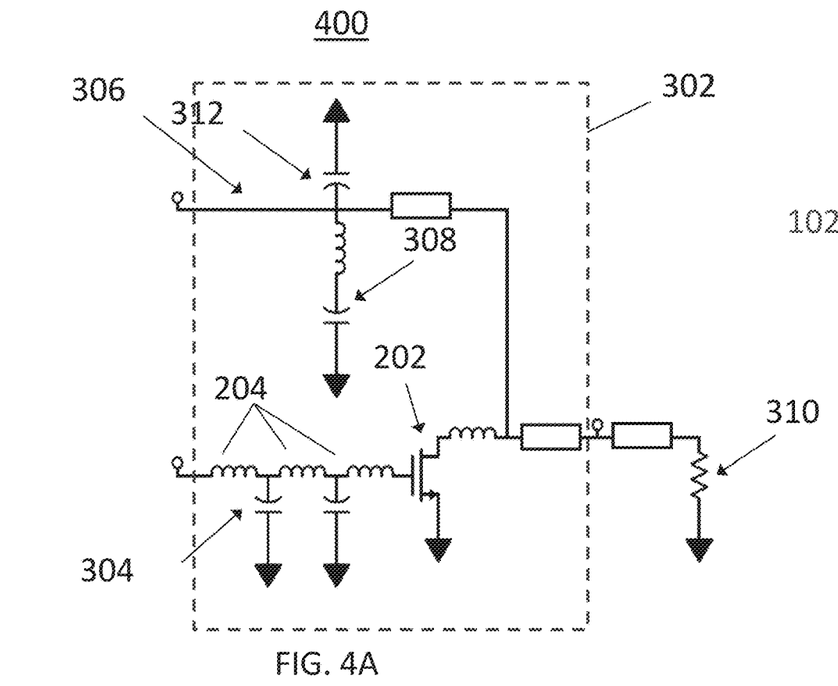
FIG. 4A depicts an equivalent schematic of the packaged RF amplifier.
Figure 4B:
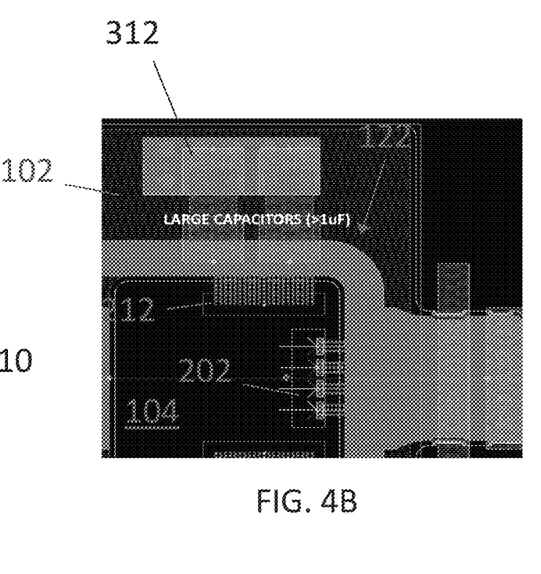
FIG. 4B depicts a close-up view of the package portion that includes decoupling capacitors.

Referring to FIG. 4, an amplifier circuit 400 is depicted, according to another embodiment. The amplifier circuit 400 is substantially identical to the amplifier circuit 300 described with reference to FIG. 3 with the exception that the DC decoupling capacitor 312 is mounted within the RF amplifier package 100 in the embodiment of FIG. 4. FIG. 4A shows a close-up view of the RF amplifier package 100 showing a potential mounting location for the DC decoupling capacitor 312. FIG. 4B shows an equivalent circuit schematic of the amplifier circuit 400.

In this embodiment, the DC decoupling capacitor 312 is mounted on a portion of the body section 102 that is outside of the die pad 104. This portion of the body section 102 can include openings in the window frame 108 enable a direct electrical connection between a lower terminal of the DC decoupling capacitor 312 and the PCB metallization layers that are provided within the body section 102. In this way, an electrical connection between the lower terminal of the DC decoupling capacitor 312 and the reference potential terminal of the RF amplifier package 100 can be effectuated. An upper terminal of the DC decoupling capacitor 312 is electrically connected to the first biasing strip 122 using an electrically conductive medium, for example bond wires, solder or conductive epoxy. Alternatively, any electrical connection mechanism such as bond wires may be used to effectuate this electrical connection.

The arrangement of FIG. 4 advantageously places the DC decoupling capacitor 312 very close to the output terminal of the RF transistor 202 in comparison to a conventional straight bonded design. This advantageously improves baseband performance by minimizing the parasitic inductance between the output terminal of the RF transistor 202 and the DC decoupling capacitor 312.

Figures 5, 5A, 5B:
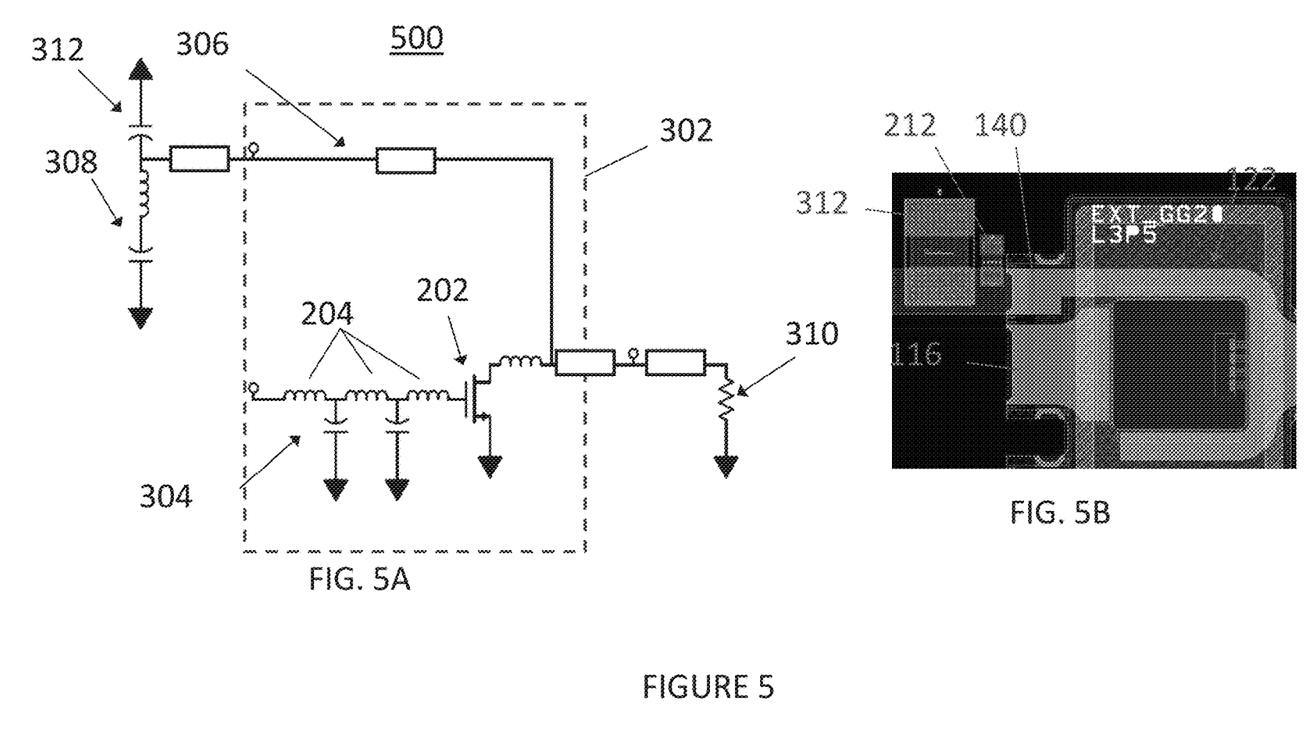

Referring to FIG. 5, an amplifier circuit 500 is depicted, according to another embodiment. The amplifier circuit 500 can be substantially identical to the amplifier circuit 300 described with reference to FIG. 3 with the exception that both the DC decoupling capacitor 312 and the first capacitor 212 that is used for the first LC resonator 308 is provided outside of the RF amplifier package 100. Both of these capacitors 308, 212 can be provided in an external apparatus such as a PCB near the first edge side 116 of the body section 102 and electrically connected to the first biasing strip 122 using, e.g., the enlarged pad portion 140 of the biasing strip as described with reference to FIG. 2.

The configuration of FIG. 5 may be particularly advantageous in low frequency applications (e.g., RF frequencies below 1 GHZ) in which the large inductances required to implement the LC shunt match circuit would otherwise require long bond wires, which have poor mechanical stability and tend to overheat. The configuration of FIG. 5 advantageously allows for the inductance of the LC shunt match to be predominately attributable to the first biasing strip 122 which can be part of a PCB structure and is thus more easily tailored than equivalent bond wires.

Referring to FIG. 6, an amplifier circuit 600 is depicted, according to another embodiment. The amplifier circuit 600 can be substantially identical to the amplifier circuit 300 described with reference to FIG. 3 with the exception that a second LC resonator 602 is connected to the output terminal of the RF transistor 202. The second LC resonator 602 is provided within the RF amplifier package 100.

Figure 6A:
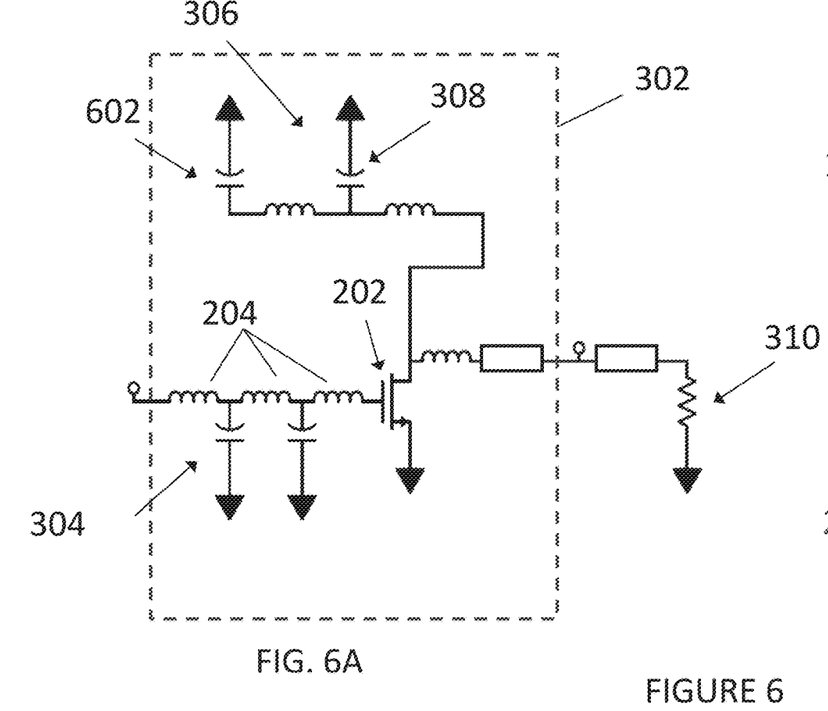
FIG. 6A depicts an equivalent schematic of the packaged RF amplifier.

FIG. 6A depicts an equivalent circuit schematic of the amplifier circuit 600. In this example, the output impedance matching network 306 is configured as a so called "harmonic shunt match." In this configuration, the first LC resonator 308 forms a parallel resonant circuit with the characteristic output impedance of the RF transistor 202 in the manner previously described. In some cases, this shunt match topology tends to present low impedance to higher order harmonics of the RF signal, which is undesirable for class F operation. Class F amplifier amplifiers require high impedance at the higher order harmonics (e.g., the second and third harmonics). By splitting the shunt match inductor in two and placing a small capacitance in the middle, Class F harmonic matching can be achieved by adding only one additional component to the circuit. The schematic of FIG. 6A depicts one implementation of this concept in which a second LC resonator 602 is provided by adding one additional component. The second LC resonator 602 resonates at one of the higher order harmonics (e.g., the second harmonic). This concept can be used to form multiple LC resonators that are each tuned to one of the higher order harmonics (e.g., the second harmonic and the third harmonic, etc.).

Figure 6B:
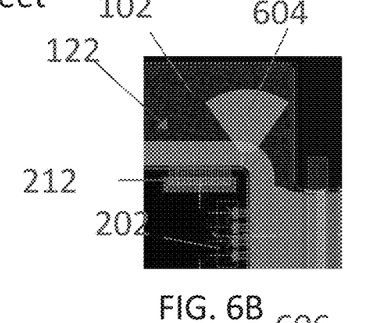
FIG. 6B depicts a close-up view of the package portion that includes a radial stub.

FIG. 6B depicts a close-up view of the RF amplifier package 100 showing a potential implementation of the amplifier circuit 600 of FIG. 6A, according to an embodiment. In this embodiment, the second LC resonator 602 is provided by incorporating a radial stub 604 in the RF amplifier package 100. A "radial stub" as used herein refers to a microstripline feature in which the transmission line gradually expands and has a curved outer edge at the widest portion of the transmission line. The physical geometry of the radial stub 604 can be tailored to provide a desired RF impedance response, including that of a capacitor at a given frequency. The radial stub 104 is provided in a portion of the body section 102 that is outside of the die pad 104, and connects to the first biasing strip 122 at a location that is between the output terminal of the RF transistor 202 and the first capacitor 212.

Figure 6C:
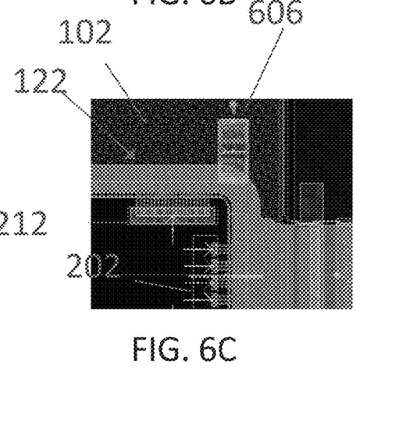
FIG. 6C depicts a close-up view of the package portion that includes a surface mount technology capacitor.

FIG. 6C depicts shows a close-up view of the RF amplifier package 100 showing a potential implementation of the amplifier circuit 600 of FIG. 6A, according to another embodiment. In this embodiment, the second LC resonator 602 is provided by a discrete SMT (surface mount technology) capacitor 606 that is mounted on a portion of the body section 102 that is outside of the die pad 104. The SMT capacitor is electrically connected to first biasing strip 122 at a location that is between the output terminal of the RF transistor 202 and the first capacitor 212.

The term "immediately adjacent" as used herein describes a proximity between two elements in which no other intentionally formed features are disposed between the immediately adjacent elements. For example, embodiments described herein refer to a second elongated section 138 of the first biasing strip 122 that is immediately adjacent to the third side 130 of the die pad 104. This means that there are no other intentionally formed structures (e.g., discrete elements, metallization pads, etc.) disposed between the second elongated section 138 and the third side 130 of the die pad 104. The second elongated section 138 of the first biasing strip 122 may be spaced apart from the third side 130 of the die pad 104 with only vacant portions of the body section 102 between the two elements and be "immediately adjacent" to the third side 130 of the die pad 104.

The term "electrically connected" as used herein describes a permanent low-ohmic, i.e., low-resistance, connection between electrically connected elements, for example a wire connection between the concerned elements. By contrast, the term "electrically coupled" contemplates a connection in which there is not necessarily a low-resistance connection and/or not necessarily a permanent connection between the coupled elements. For instance, active elements, such as transistors, as well as passive elements, such as inductors, capacitors, diodes, resistors, etc., may electrically couple two elements together.

Terms such as "same," "match," and "matches" as used herein are intended to mean identical, nearly identical or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like are used to describe various elements, regions, sections, etc., and are also not intended to be limiting. Like terms refer to like elements throughout the description.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An RF amplifier package, comprising:
   a flange shaped body section,
   an electrically conductive die pad centrally located on the body section;
   an electrically insulating window frame disposed on an upper surface of the body section and surrounding the die pad;
   a first electrically conductive lead disposed on the window frame adjacent to a first side of the die pad and extending away from the first side of the die pad towards a first edge side of the body section
   a second electrically conductive lead disposed on the window frame adjacent to a second side of the die pad and extending away from the second side of the die pad towards a second edge side of the body section, the second side of the die pad being opposite the first side of the die pad; and
   a first electrically conductive biasing strip that is: disposed on the window frame, continuously connected to the second lead, and extends along and a third side of the die pad, the third side of the die pad extending between the first and second sides of the die pad.

2. The RF amplifier package of claim 1, wherein the second and third sides of the die pad are linear, wherein the second and third sides of the die pad form an angled intersection with one another, and wherein the first electrically conductive biasing strip extends around the angled intersection immediately adjacent to the angled intersection.

3. The RF amplifier package of claim 2, wherein the first electrically conductive biasing strip comprises a first section that is connected to the second lead and extends along a portion of the second side of the die pad, and a second elongated section that extends along the third side of the die pad while being immediately adjacent to the third side of the die pad, wherein the first section and the second elongated section of the biasing strip form an angled intersection with one another immediately adjacent to the angled intersection between the second and third sides of the die pad.

4. The RF amplifier package of claim 2, wherein the second and third sides of the die pad form a substantially perpendicular angle with one another, and wherein the first and second elongated sections of the biasing strip form a substantially perpendicular angle with one another.

5. The RF amplifier package of claim 2, wherein the second elongated section of the first electrically conductive biasing strip extends completely along the third side of the die pad while being immediately adjacent to the third side of the die pad.

6. The RF amplifier package of claim 5, wherein the second elongated section of the first electrically conductive biasing strip extends continuously to the first edge side of the body section.

7. The RF amplifier package of claim 2, wherein the electrically conductive die pad is vertically recessed on a plane that is beneath the upper surface of the body section.

8. The RF amplifier package of claim 1, further comprising:
   a second electrically conductive biasing strip that is: disposed on the window frame, continuously connected to the second lead, and extends along and a fourth side of the die pad, the fourth side of the die pad extending between the first and second sides of the die pad and being opposite the third side of the die pad.

9. An RF amplifier package, comprising:
   a flange shaped body section comprising a first edge side and a second edge side opposite the first edge side,
   an electrically conductive die pad centrally located on the body section between the first and second edge sides;
   an electrically insulating window frame disposed on an upper surface of the body section and surrounding the die pad; and
   a continuous electrically conductive structure disposed on the window frame and electrically insulated from the die pad, wherein the continuous electrically conductive structure comprises:
      a lead portion extending away from the die pad towards the second edge side of the body section; and
      a biasing strip that extends around an outer perimeter of the die pad towards the first edge side of the body section.

10. The RF amplifier package of claim 9, wherein the die pad is rectangular, and wherein the biasing strip comprises first and second elongated sections that are disposed immediately adjacent to edge sides of the die pad and extend around a corner of the die pad.

11. The RF amplifier package of claim 10, wherein the second elongated section of the biasing strip extends to the first edge side of the flange.

12. A packaged RF amplifier, comprising:
    an RF package, comprising: a flange shaped body section, an electrically conductive die pad, an electrically conductive input lead that is insulated from the die pad and extends away from a first edge side of the die pad, an electrically conductive output lead that is insulated from the die pad and extends away from a second edge side of the die pad in an opposite direction as the input lead, and a first electrically conductive biasing strip that is continuously connected to the electrically conductive output lead and extends around an outer perimeter of the die pad towards the first edge side of the flange; and
    an RF transistor mounted on the die pad, the RF transistor comprising: a control terminal that is electrically coupled to the input lead, a reference potential terminal that directly faces and is electrically connected to the die pad, and an output terminal that is electrically connected to the output lead.

13. The packaged RF amplifier of claim 12, wherein the first biasing strip comprises a first section that is connected to the output lead and extends along a portion of a second side of the die pad, and a second elongated section that extends along a third side of the die pad while being immediately adjacent to the third side of the die pad, the second and third sides of the die pad forming an angled intersection with one another.

14. The packaged RF amplifier of claim 13, further comprising:
    a capacitor mounted on the die pad, the capacitor comprising a first terminal that directly faces and is electrically connected to the die pad and a second terminal that is electrically connected to the first biasing strip.

15. The packaged RF amplifier of claim 14, further comprising:
    a first set of electrically conductive bond wires that provides the electrical connection between the output terminal of the RF transistor and the output lead,
    a second set of electrically conductive bond wires that provides the electrical connection between the second terminal of the capacitor and the first biasing strip, wherein each of the bond wires in the first set extend directly from the output terminal of the RF transistor to the output lead, and wherein each of the bond wires in the second set extend directly from the second terminal of the capacitor to the first biasing strip.

16. The packaged RF amplifier of claim 13, further comprising one or more passive electrical components disposed on an upper surface of the body section that is outside of the die pad, and wherein the one or more passive electrical components is electrically connected to the second elongated section.

17. The packaged RF amplifier of claim 16, wherein the one or more passive electrical components comprise a surface mount capacitor having an upper terminal that is electrically connected to the second elongated section.

18. The packaged RF amplifier of claim 16, wherein the one or more passive electrical components comprise a radial stub.

* * * * *